United States Patent [19]

Dietl

[11] Patent Number: 4,704,561
[45] Date of Patent: Nov. 3, 1987

[54] PUSH-PULL GENERATOR

[75] Inventor: Joachim Dietl, Heilbronn, Fed. Rep. of Germany

[73] Assignee: Telefunken electronic GmbH, Heilbronn, Fed. Rep. of Germany

[21] Appl. No.: 825,794

[22] Filed: Feb. 3, 1986

[30] Foreign Application Priority Data

Feb. 13, 1985 [DE] Fed. Rep. of Germany ....... 3504803

[51] Int. Cl.$^4$ ................... H05B 41/29; H02M 7/537
[52] U.S. Cl. .............................. 315/219; 315/209 T; 315/209 R; 315/210; 315/220; 315/266; 315/DIG. 5; 315/DIG. 7; 331/112; 331/114
[58] Field of Search ................. 315/DIG. 7, DIG. 5, 315/209 T, 209 R, 266, 210, 220; 331/112, 114

[56] References Cited

U.S. PATENT DOCUMENTS 4,016,479  4/1977  Reible et al. .................. 321/45 R
4,574,221  3/1986  Hess et al. ..................... 315/209 T Primary Examiner—David K. Moore
Assistant Examiner—Michael J. Nickerson
Attorney, Agent, or Firm—Spencer & Frank

[57] ABSTRACT

A push-pull generator with a driver stage and a push-pull output stage. A parallel connection of a resistor (R3, R4) with a control transistor (T3, T4) is provided in the base line of each output stage transistor. In the push-pull output stage, resistors (R1, R2) are provided at which a voltage drop is caused by the output stage current. Depending on the magnitude of the voltage drop the control transistors (T3, T4) located parallel to the resistors in the base lines are either activated or blocked.

7 Claims, 1 Drawing Figure

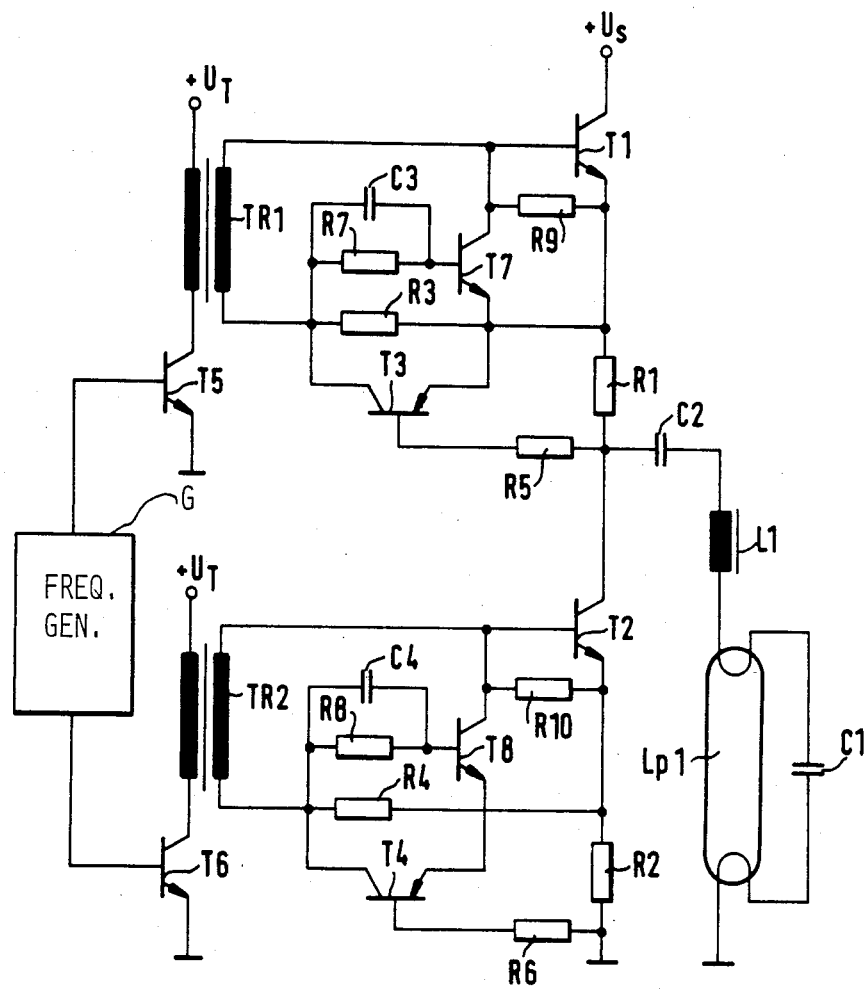
FIG.

PUSH-PULL GENERATOR

BACKGROUND OF THE INVENTION

The invention relates to a push-pull generator with a driver stage and a push-pull output stage, in particular, for operating fluorescent lamps.

If such a generator is used to operate fluorescent lamps, the switching-on requires in the ignition phase a high current which must be supplied by the transistorized push-pull output stage. In the ignition phase, relatively large collector currents therefore flow in the output stage transistors and require correspondingly large base currents.

SUMMARY OF THE INVENTION

The object of the invention is to provide a push-pull generator which in the event of large output stage currents provides a correspondingly large base current for the output stage transistors, but which simultaneously ensures that in the event of smaller output stage currents, the base current of the output stage transistors becomes correspondingly smaller. According to the invention there is provided a push-pull generator with a driver stage and a push-pull output stage wherein a parallel connection of a resistor with a transistor is provided in the base lines of the output stage transistors and wherein there are provided in the push-pull output stage resistors at which a voltage drop is caused by the output stage current and, depending on the size, activates or blocks the transistors located parallel to the resistors in the base lines.

By correspondingly dimensioning the resistors in the push-pull output stage, the transistors in the base lines are open in the event of small output stage currents and short-circuit or bridge the parallel resistors in the event of large output stage currents. This is equivalent to large base currents in the event of large collector currents of the output stage transistors and small base currents in the event of small collector current of the output stage transistors.

By relatively small base currents during rated current operation, i.e., in the case of the lamp when the lamp is burning, too high control losses are avoided and also large and consequently expensive drive transformers can be eliminated.

In accordance with a further development of the invention, there is allocated to each output stage transistor a circuit section comprising a transistor located parallel to the base emitter section of the output stage transistor, a resistor located parallel to the emitter collector section of this transistor, and also a parallel connection of a resistor with a capacitor located in the base line of the output stage transistor. The purpose of this circuit section is to clear the output stage transistors at the base in order to obtain short storage times and also good switching-off behavior of the output stage transistors.

BRIEF DESCRIPTION OF THE DRAWING

The invention will now be described in greater detail, by way of examples, with reference to the drawing, in which the sole FIGURE shows a lamp generator whose driver stage is controlled by a frequency generator in accordance with the invention.

DESCRIPTION OF THE PREFERRED EMBODIMENTS

The FIGURE shows one embodiment of a lamp generator whose driver stage is controlled by a frequency generator G. The frequency generator G supplies a pulse signal and controls the bases of the driver transistors T5 and T6. Connected in series with the emitter collector section of the first driver transistor T5 is the primary coil of a first driver transformer TR1 and connected in series with the emitter collector section of the second driver transistor T6 is the primary coil of a second driver transformer TR2. One end of the primary coil of the first driver transformer TR1 is connected to the driver voltage $+U_T$ and its other end is connected to the collector of the first driver transistor T5. Similarly, one end of the primary coil of the second driver transformer TR2 is connected to the driver voltage $+U_T$ and its other end is connected to the collector of the second driver transistor T6.

If the first driver transistor T5 is activated in the positive half-wave of the pulse signal, the second driver transistor T6 is activated in the negative half-wave of the pulse signal. Activation of the transistor T5 causes a current to flow through the primary coil of the first driver transformer TR1 which produces in the secondary coil of the driver transformer TR1 a voltage which reaches the base of the first output stage transistor T1 and activates this transistor. The push-pull output stage is formed by a series connection of the emitter collector section of the first output stage transistor T1 with a resistor R1, and a series connection of the emitter collector section of the second output stage transistor T2 and a resistor R2. If in the circuit shown in the FIGURE, the driver transistor T5 is conductive, the output stage transistor T1 is therefore also simultaneously conductive. The same applies to the transistors T6 and T2.

If the output stage transistor T1 is conductive, a current flow through a series connection consisting of the transistor T1, the resistor R1, a capacitor C2, a coil L1 and a capacitor C1 or a lamp Lp1, provided that the transistor T2 is not conductive at this point in time. This condition is, however, met in the circuit shown in the FIGURE since, on account of the chosen circuit, T2 is not conductive when T1 is conductive.

If, on the other hand, the transistor T6 is conductive and the transistor T5 is blocked, as is the case in a certain half-wave of the pulse signal and in the present example in the negative half-wave, a voltage which activates the transistor T2 is produced at the secondary coil of the driver transformer TR2 by the current flowing through the primary coil of the dr1ver transformer TR2. Since the transistor T1 is blocked when the transistor T2 is conductive, no current can flow in this phase (e.g. negative half-wave of the pulse signal) through the section "R1, T1", so that the current flows through the transistor T2 in a circuit formed by the capacitor C1 and the fluorescent lamp Lp1, by the inductor L1, by the capacitor C2 transistor T2 and by the resistor R2. During the one half-wave of the pulse signal, a current therefore flows through the transistor T1, the resistor R1 and the lamp section "Lp1 or C1, L1, C2", while in the other half-wave a current flows through the lamp section "Lp1 or C1, L1, C2" and also through the transistor T2 and the resistor R2.

A relatively high voltage is required at the capacitor C1 to ignite the fluorescent lamp Lp1. The load for the bridge circuit of the FIGURE is a series resonance circuit consisting of a small inductor L1 determined by the switching frequency and the lamp power, and of the capacitor C1. Arranged parallel to the capacitor C1 is the fluorescent lamp Lp1 which in the switched-off state does not constitute a substantial damping for the capacitor C1. On switching on generator G, a sufficiently high resonance current and thus a high resonance voltage which results in ignition of the lamp Lp1, can therefore he produced at the capacitor C1. After ignition of the lamp Lp1, the capacitor C1 is damped by the lamp resistance to such a high degree that it is no longer effective. During normal operation (burning lamp), the lamp current is consequently determined by the inductor L1. A large ignition current and thus a large collector current in the transistor T1 or T2 requires in the frequency range up to 30 kHz a large base current for the transistors T1 and T2. A large base current is, however, undesirable during normal operation (burning lamp) since a high base current during normal operation would result in high control losses and bad switching behavior of the switching transistors T1, T2. Also, large and thus expensive drive transformers would be required.

To ensure that a high base current is not present during rated current operation, in contrast to the switching-on operation, there is connected in the base emitter section of the switching transistors T1 and T2, in accordance with the invention, a resistor which is designated in the case of the transistor T1 by R3 and in the case of the transistor T2 by R4. These resistors are bridged by transistors, more particularly, the resistor R3 is bridged by the transistor T3 and the resistor R4 by the transistor T4. Also, in accordance with the invention, there are inserted in the output stage, resistors R1 and R2, with the resistor R1 being connected, on the one hand, to the emitter of the transistor T1 and, on the other hand, directly or via a resistor R5 to the base of the transistor T3, and with the resistor R2 being connected, on the one hand, to the emitter of the transistor T2 and, on the other hand, directly or via a resistor R6 to the base of the transistor T4. In addition to the aforementioned resistors R3, R4, there are also arranged in the base emitter section of the transistors T1 and T2, the secondary coils of transformers TR1 and TR2, respectively.

With the circuit section just described, it is possible, during the ignition phase, to provide the necessary high base current and to reduce the base current under rated load conditions in such a way that good switching behavior of the switching transistors T1, T2 is obtained. The relatively small base current during rated operation is caused by the voltage drop at the resistors R1 and R2 being so small during rated operation, on account of the low operating current required by the lamp Lp1 rated operation, that no base current can flow into the transistors T3 and T4. This effect is further increased by the limiting resistors R5 and R6. If no base current can flow into the transistors T3 and T4, these transistors are blocked and the base current flowing into the output stage transistors T1 and T2 is thus limited to the desired extent by the resistors R3 and R4, respectively.

If, on the other hand, the circuit is not in operation, by application of the operating voltage $+U_s$, a very high ignition current flows through the section T1, R1, C2, L1, C1 or R2, T2, C2, L1, C1 for a short time. This high ignition current which originates from the resonance resistance "zero" of the resonance circuit consisting of L1 and C1 (without damping by Lp1 prior to the burning of the lamp), produces a relatively high voltage drop at the resistors R1 and R2 which is sufficient to activate the transistors T3 and T4 via the current limiting resistors R5 and R6. If the transistors T3 and T4 are activated they short-circuit the resistors R3 and R4, with the result that a sufficiently high base current for the ignition phase is available for the output stage tranistors T1 and T2.

In accordance with a further development of the invention a transistor T7 is connected parallel to the base emitter section of the output stage transistor T1 in the circuit shown in the FIGURE. Similarly, a transistor T8 is located parallel to the base emitter section of the second output stage transistor T2. As is also apparent from the FIGURE, there is located parallel to the collector emitter section of the transistor T7, a resistor R9 and parallel to the collector emitter section of the transistor T8, a resistor R10. Also located in the base line of the output stage transistor T1 is the parallel connection of a resistor R7 with a capacitor C3, and in the base line of the output stage transistor T2, the parallel connection of a resistor R8 with a capacitor C4.

The last mentioned circuit section with the transistors T7 and T8, respectively, the resistors R9 and R10, respectively, and the parallel connection of the resistors R7 and R8, respectively, with the capacitors C3 and C4, respectively, has the following function. During rated operation of the lamp and the flux phase of the respective transistors T1 or T2, the voltage drop at the resistors R3 and R4 is directed so that the transistors T7 and T8 do not receive any drive current via the resistors R7 and R8, respectively, and the capacitors C3 and C4, respectively, and are therefore blocked. If the transistors T1 and T2, respectively, are now brought into the blocked phase via their driver transformers TR1 and TR2, respectively, by polarity reversal of the voltage $U_{TR1}$ or $U_{TR2}$, a current flows via the resistors R9 and R3, and R10 and R4, respectively, and directs the voltage drop at R3 and R4, respectively, so way that the transistors T7 and T8, respectively, are activated for a short time in accordance with the time constant of the RC members R7, C3 and R8, C4, respectively, and clear to a high degree the output stage transistors T1 and T2, respectively, at the base. This measure results in short storage times and good switching-off behavior for the output stage transistors T1 and T2.

What is claimed is:
1. A push-pull generator, comprising:
   a push-pull output stage including first and second output stage transistors, and first and second output stage resistors connected in the collector emitter paths of said first and second output stage transistors, respectively; and
   driver stage means connected to the respective bases of said first and second output stage transistors for driving said first and second output stage transistors to be alternatingly conductive and nonconductive, said driver stage means including first and second parallel combinations each having a control transistor and a resistor connected in parallel with the collector emitter path of said control transistor, and each said parallel combination being connected to a respective one of the bases of said first and second output stage transistors;

wherein an output current through said first and second output stage transistors produces a voltage drop across a respective one of said first and second output stage resistors, and a respective one of said control transistors is activated or blocked in dependence of the magnitude of the voltage drop across said respective output stage resistor.

2. Push-pull generator according to claim 1, wherein each said output stage resistor has a resistance value selected so that a small output current therethrough produces a voltage drop that blocks the respective control transistor and a relatively large output current therethrough produces a voltage drop that activates the respective control transistor to effectively short-circuit the resistor connected in parallel therewith.

3. Push-pull generator according to claim 1, wherein said first output stage resistor is connected between the emitter of said first output stage transistor and the collector of said second output stage transistor, and said second output stage resistor is connected between the emitter of said second output stage transistor and a circuit point held at a reference potential.

4. Push-pull generator according to claim 1, wherein said first output stage resistor has one end connected to the resistor of said first parallel combination and another end connected to the base of the control transistor of said first parallel combination, and said second output stage resistor has a first end connected to the resistor of said second parallel combination and another end connected to the base of the control transistor of said second parallel combination.

5. Push-pull generator according to claim 1, wherein said driver stage means further includes two transistors each connected in parallel with the respective one of the base emitter paths of said first and second output stage transistors.

6. Push-pull generator according to claim 5, wherein said driver stage means further includes two resistors each connected in parallel with a respective one of the collector emitter paths of said two transistors.

7. Push-pull generator according to claim 1, wherein said driver stage means further includes two parallel circuits each comprising a resistor and a capacitor connected in parallel therewith, and each said parallel circuit is connected to a respective one of the bases of said first and second output stage transistors.

* * * * *